(12) United States Patent
Nghiem et al.

(10) Patent No.: US 8,470,434 B2
(45) Date of Patent: Jun. 25, 2013

(54) GLASS SUBSTRATE COATED WITH LAYERS HAVING AN IMPROVED MECHANICAL STRENGTH

(75) Inventors: Bernard Nghiem, Arsy (FR); Emilie Viasnoff, Sevres (FR); Bertrand Kuhn, Paris (FR); David Le Bellac, Courbevoie (FR); Anne Durandeau, Paris (FR); Fabrice Abbott, Vienne (FR); Eddy Royer, Villemomble (FR); Georges Zagdoun, La Garenne Colombes (FR); Olivier Dubois, Mareil Marly (FR)

(73) Assignee: Saint-Gobain Glass France, Courbevoie (FR)

( * ) Notice: Subject to any disclaimer, the term of this patent is extended or adjusted under 35 U.S.C. 154(b) by 610 days.

(21) Appl. No.: 12/523,174

(22) PCT Filed: Jan. 14, 2008

(86) PCT No.: PCT/FR2008/050063
§ 371 (c)(1),
(2), (4) Date: Aug. 24, 2010

(87) PCT Pub. No.: WO2008/099115
PCT Pub. Date: Aug. 21, 2008

(65) Prior Publication Data
US 2010/0313936 A1    Dec. 16, 2010

(30) Foreign Application Priority Data

Jan. 15, 2007  (FR) .................................... 07 52664
Mar. 21, 2007  (FR) .................................... 07 53943

(51) Int. Cl.
*C03C 17/34* (2006.01)
(52) U.S. Cl.
USPC ........... 428/220; 428/426; 428/428; 428/432; 428/450; 428/469; 428/697; 428/698; 428/699; 428/702; 136/252; 427/576; 427/577; 427/578; 427/579; 427/585; 427/249.15; 427/249.17; 427/249.19; 427/255.15; 427/255.18; 427/255.7

(58) Field of Classification Search
None
See application file for complete search history.

(56) References Cited

U.S. PATENT DOCUMENTS

| 4,187,336 | A  | * | 2/1980 | Gordon ........................ 428/34 |
| 5,811,191 | A  | * | 9/1998 | Neuman ....................... 428/427 |
| 6,174,599 | B1 | * | 1/2001 | Boire et al. .................. 428/336 |
| 6,265,076 | B1 | * | 7/2001 | McCurdy et al. ............ 428/432 |
| 6,403,147 | B1 |   | 6/2002 | McCurdy et al. |
| 6,838,181 | B1 | * | 1/2005 | Degand ........................ 428/434 |
| 7,192,647 | B2 | * | 3/2007 | Hartig .......................... 428/432 |
| 2005/0026002 | A1 | * | 2/2005 | Hartig .......................... 428/702 |
| 2006/0029813 | A1 |   | 2/2006 | Kutilek et al. |
| 2006/0266409 | A1 | * | 11/2006 | Takeda et al. ................ 136/252 |
| 2008/0047603 | A1 | * | 2/2008 | Krasnov ...................... 136/256 |

FOREIGN PATENT DOCUMENTS

| EP | 0 573 325 A1 | 12/1993 |
| EP | 0 927 706 A2 | 7/1999 |
| EP | 0 927 706 A3 | 7/1999 |
| FR | 2 736 632 A1 | 1/1997 |
| WO | WO 2004113246 A2 * | 12/2004 |

OTHER PUBLICATIONS

U.S. Appl. No. 13/496,090, filed Mar. 14, 2012, Kharchenko, et al.

* cited by examiner

Primary Examiner — David Sample
(74) Attorney, Agent, or Firm — Oblon, Spivak, McClelland, Maier & Neustadt, L.L.P.

(57) ABSTRACT

The invention relates to
- a transparent glass substrate, associated with a transparent electro-conductive layer capable of constituting an electrode of a photovoltaic cell and composed of a doped oxide, characterized by the interposition, between the glass substrate and the transparent electroconductive layer, of a mixed layer of one or more first nitride(s) or oxynitride(s), or oxide(s) or oxycarbide(s) having good adhesive properties with glass, and one or more second nitride(s) or oxynitride(s) or oxide(s) or oxycarbide(s) capable of constituting, possibly in the doped state, a transparent electroconductive layer;
- a method for producing this substrate;
- a photovoltaic cell, a tempered and/or curved glass, a shaped heating glass, a plasma screen and a flat lamp electrode having this substrate.

35 Claims, No Drawings

GLASS SUBSTRATE COATED WITH LAYERS HAVING AN IMPROVED MECHANICAL STRENGTH

The present invention relates to transparent conductive layers, notably based on oxides, of great value on a glass substrate.

Examples of these are ITO (indium tin oxide) layers, indium oxide doped with tin, and $SnO_2$:F layers of tin oxide doped with fluorine. Such layers constitute electrodes in some applications: lamps, electroluminescent glazing, electrochromic glazing, liquid crystal display screens, plasma screens, photovoltaic glazing and heating glasses. In other applications for low-emission glazing, for example, these transparent conductive layers do not have to be activated by putting them under an electrical voltage.

In the prior art, these transparent conductive layers are in general associated with a sub-layer for improving the optical properties of a layer or of a multilayer of transparent conductive layers on a glass substrate. Without being exhaustive, mention may notably be made of EP 611 733 PPG which proposes a mixed layer with a gradient of silicon oxide and tin oxide in order to prevent iridescence effects induced by a transparent conductive layer of tin oxide doped with fluorine. Patents by Gordon Roy FR 2 419 335 also propose a variant of this sub-layer in order to improve the color properties of a transparent conductive layer of tin oxide doped with fluorine. The precursors cited in this patent cannot on the other hand be used on the industrial scale. Saint-Gobain also possesses know-how in this field: patent FR 2 736 632 thus provides a mixed sub-layer with an inverse index gradient of silicon oxide and tin oxide as an anti-color sub-layer of a transparent conductive layer of tin oxide doped with fluorine.

On the other hand, it has been found that there is a tendency for transparent conductive oxide layers on glass to delaminate in photovoltaic cells or in the active applications previously mentioned. A test for characterizing this phenomenon consists of subjecting the glass and its electrode for example for ten minutes to the joint action of electrical fields of the order of 200 V for example, either side of the glass and at temperatures of approximately 200° C. The action of an electrical field at these temperatures induces, during the duration of the test, a total of electrical charges moved by 1 to 8 $mC/cm^2$ according to the electrical resistivity values of the glass at the test temperature. These delaminations are also observed with the sub-layers mentioned in the prior art. Such delaminations are also observed in the case of curved glasses. These delaminations cannot be detected by a skilled person if these glasses coated in this way do not have an electric current passing through them. On the other hand, in the case of applications where the glass coated in this way is traversed by an electric current, as is the case for a heating glass, for example, the presence of these delaminations then eliminates functionality.

In order to solve the problems of delamination of conductive transparent oxide layers deposited on a glass substrate, the inventors have developed a sub-layer linking a glass substrate to a transparent conductive oxide layer, improving considerably the adhesion of the latter, notably under conditions where the assembly is put under an electric field and at high temperatures, greater than a 100 or even 150° C., or notably when the glass is curved (curved and/or annealed).

The object of the invention is therefore a transparent glass substrate, associated with a transparent electro-conductive layer capable of constituting an electrode of a photovoltaic cell and composed of a doped oxide, characterized by the interposition, between the glass substrate and the transparent electroconductive layer, of a mixed layer of one or more first nitride (s) or oxynitride(s), or oxide(s) or oxycarbide(s) having good adhesive properties with glass, and one or more second nitride(s) or oxynitride(s) or oxide(s) or oxycarbide(s) capable of constituting, possibly in the doped state, a transparent electroconductive layer.

In this way, the invention makes it possible to obtain suitable multilayers for photovoltaic cells, of which the mechanical strength on the glass substrate is not affected by the presence of an electric field and by a high temperature. This considerable improvement may be obtained for large glass areas (FFW—full float width), since deposition methods compatible with such dimensions are available for the layers concerned.

This satisfactory mechanical strength is also noted after tempering and bending treatment, including at radii of curvature as small as 200 mm. Thus, the transparent electrically conductive layer of the substrate of the invention is not only capable of constituting a photovoltaic cell electrode but also a coating having excellent adhesion on tempered and/or curved glass. A low-emission coating may be mentioned as an example, notably on the face of glazing in a building turned inwards so as to reflect and preserve ambient temperature.

In a subsidiary manner, the mixed sub-layer is not, where this is appropriate, a barrier to the migration of alkalis of the glass to the transparent conductive layer. It is advantageously not dense so as to allow alkalis of the glass to pass and the glass itself to be conductive.

In a subsidiary manner, the transparent substrate of the invention has improved optical properties compared with those of transparent electroconductive layers on a glass substrate: reduced iridescence and more uniform coloration in reflection.

According to preferred embodiments of the invention:
  said mixed layer has a composition gradient in the direction of a decreasing proportion of the first nitride(s) or oxynitride(s), or oxide)s) or oxycarbide(s) with increasing distance from the glass substrate;
  said mixed layer has a composition gradient in the direction of an increasing proportion of the first nitride(s) or oxynitride(s), or oxide(s) or oxycarbide(s) with increasing distance from the glass substrate.

Advantageously, the substrate of the invention is characterized in that its mechanical strength is unaffected in the 24 hours following a treatment of at least 10 minutes, preferably 20 minutes, by an electric field of at least 100 V, preferably 200 V either side of the substrate, and a temperature of at least 200° C., inducing a movement of electrical charges of at least 2 $mC/cm^2$, preferably 8 $mC/cm^2$ according to values for the electrical resistivity of the glass substrate at the test temperature. Mechanical strength is understood to mean that the multilayer or part of the multilayer does not delaminate.

According to other characteristics of the substrate of the invention:
  the multilayer of said mixed layer with said transparent electroconductive layer has a haze at most equal to 30%,
  said mixed layer has, at its interface with said transparent electroconductive layer, a surface consisting of small rods oriented randomly, 10 to 50 nm long, with 5 to 20 nm diameters, forming an rms roughness of 10 to 50 nm, and causing an increase in haze of the complete multilayer of 5 to 10% relative to the same multilayer of said mixed layer with said transparent electroconductive layer, where the first named has a smooth surface (in a photovoltaic application, a high haze is sought), a light transmission (transmission in the visible weighted by the sensitivity curve of the human eye—standard ISO 9050) at least equal to 75%, preferably 80%, a surface resistance, $R_\square$, defined as the electrical resistance measured at the terminals of two linear parallel electrodes of the same length L, and distant apart by this length L, these two electrodes being in electrical contact over all their length with the electroconductive face of the substrate, of between 5 and 1000 Ω, an absorption in the visible and near-infrared at most equal to 10%.

According to other characteristics of the invention, and notably when it is essential to be able to see through the glass:

the multilayer of said mixed layer with said transparent electroconductive layer has a haze less than 5%, preferably less than 1%;

a light transmission at least equal to 80%;

a surface resistance, $R_\square$, of between 10 and 1000 Ω;

a neutral color in reflection and in all cases homogeneous. Preferably, said first nitride(s) or oxynitride(s), or oxide(s) or oxycarbide(s) is/are chosen from the nitrides or oxynitrides, or oxides or oxycarbides of Si, Al and Ti, notably $SiO_2$, $TiO_2$ and $Al_2O_3$;

said second nitride(s) or oxynitride(s), or oxide(s) or oxycarbide(s) is/are chosen from the nitrides or oxynitrides, or oxides or oxycarbides of Sn, Zn and In, notably $SnO_2$, ZnO and InO;

said transparent electroconductive layer is composed of an oxide layer doped with Sn, Zn or In, such as $SnO_2$:F, $SnO_2$:Sb, ZnO:Al, ZnO:Ga, InO:Sn or ZnO:In.

With regard to the method for obtaining the mixed layer preferred within the context of the invention, and described in greater detail hereinafter, said mixed layer is electrically conductive, and non-insulating and, in particular, has a surface resistance at most equal to 100,000Ω, preferably to 10,000 Ω, has a molar ratio F/Sn at least equal to 0.01, preferably 0.05.

According to embodiments procuring an optimum combination of the desired mechanical strength and optical properties of the substrate, the thickness of said mixed layer lies between 20 and 500 nm, preferably between 50 and 300 nm;

the face of said mixed layer situated on the side of the glass substrate exclusively consists of a thickness of 2 to 20 nm of one or more first nitride(s) or oxynitride(s), or oxide(s) or oxycarbide(s), which promotes adhesion of the mixed layer to the glass;

the face of said mixed layer situated on the side opposite to that of the glass substrate consists exclusively of a thickness of 2 to 20 nm of one or more second nitride(s) or oxynitride(s), or oxide(s) or oxycarbide(s) which promotes adhesion of the mixed layer to its coating with a similar composition, such as said transparent electroconductive layer.

According to a first variant, said transparent electroconductive layer composed of a doped oxide, is connected to said mixed layer with the interposition of a layer of the same non-doped oxide, the cumulative thickness of the two non-doped oxide and doped oxide layers being between 700 and 2000 nm, and the ratio of the thicknesses of the two layers being between 1:4 and 4:1. The doped oxide layer may be covered with a layer of microcrystalline amorphous silicon, deposited by plasma-enhanced CVD (PECVD), with a view to constituting a photovoltaic cell. The two layers of non-doped oxide and doped oxide then advantageously have an RMS roughness of 20-40 nm. Indeed, the silicon absorbs relatively little light. The roughness of the underlying layers makes them diffusing and in this way it extends the path of the light in the silicon active layer, guaranteeing a sufficient number of electron-hole pairs within it, and effective trapping of the light.

According to a second variant, said transparent electroconductive layer with a thickness of between 300 and 600 nm, composed of a doped oxide, is formed directly on said mixed layer. The doped oxide layer may be covered with a cadmium-tellurium layer with a view to constituting a photovoltaic cell.

In a preferred embodiment of the substrate of the invention, said transparent electroconductive layer composed of a doped oxide is coated with a layer protecting it as regards the deposition of coatings constituting a photovoltaic cell, notably deposition by PECVD of a layer such as silicon, or a layer increasing the quantum efficiency of the photovoltaic cell, such as zinc oxide or titanium oxide.

According to an advantageous embodiment of the invention, one of the faces of the substrate (notably the glass face opposite that carrying said mixed layer) is coated with a multilayer providing a functionality of the anti-reflecting or hydrophobic or photocatalytic type.

In addition, said mixed layer may contain grains of one or more first nitride(s) or oxynitride(s), or oxide(s) or oxycarbide(s), mixed with grains of one or more second nitride(s) or oxynitride(s), or oxide(s) or oxycarbide(s)). An example of this is a mixed layer containing grains of $SiO_2$ mixed with grains of $SnO_2$.

In this case, the continuous gradient of the composition signifies a regular decrease in the proportion of grain $SiO_2$ relative to those of $SnO_2$, for example in all the thickness of the mixed layer with increasing distance from the glass substrate. This regular decrease does not however exclude a decrease in stages or in steps, or the presence of two distinct zones interlaced one in the other (in the manner of the pieces of a puzzle) with exclusive contents in only one of said first or second nitride(s) or oxynitride(s), or oxide(s) or oxycarbide(s).

Said mixed layer may also contain, additionally or alternatively, mixed grains of one or more first nitride(s) or oxynitride(s), or oxide(s) or oxycarbide(s), and one or more second nitride(s) or oxynitride(s), or oxide(s) or oxycarbide(s). An example of this is a mixed layer containing the elements Si, Sn, Al and O.

In accordance with the two preceding variants, the sizes of said grains determined under the transmission electron microscope, are between 10 and 80 nm, preferably between 20 and 50 nm.

The object of the invention is also a method for producing a substrate of which the mixed layer is obtained by deposition, by the chemical vapor phase method, resulting from putting the precursors of said first and second nitride(s) or oxynitride(s), or oxide(s) or oxycarbide(s) in contact with the substrate in the presence of at least one fluorine compound, such as tetrafluoromethane (CFO, octafluoropropane ($C_3F_8$), hexafluoroethane ($C_2F_6$), hydrogen fluoride (HF), difluoro-chloro-methane ($CHClF_2$), difluoro-chloro-ethane ($CH_3CClF_2$), trifluoromethane ($CHF_3$), dichloro-difluoromethane ($CF_2Cl_2$), trifluoro-chloromethane ($CF_3Cl$), trifluoro-bromomethane ($CF_3Br$), trifluoroacetic acid (TFA, $CF_3COOH$) and nitrogen fluoride ($NF_3$). The fluorine compound accelerates deposition of the first nitride(s) or oxynitride(s), or oxide(s) or oxycarbide(s)(notably $SiO_2$) relative to those of the second (such as $SnO_2$).

Mention may be made of:
as an $SiO_2$ precursor: tetraethoxysilane (TEOS), hexamethyldisilane (HMDSO), silane ($SiH_4$);
as an $SnO_2$ precursor: monobutyltin trichloride (MBTC1), dibutyltin diacetate (DBTA), tin tetrachloride ($SnCl_4$).

According to a first method, said mixed layer is obtained by employing Chemical Vapor Phase Deposition (CVD) enhanced by plasma (PE CVD for Plasma-Enhanced CVD), notably plasma at atmospheric pressure (AP PECVD for Atmosphere Pressure PECVD). The temperature of the substrate is then advantageously at most equal to 300° C.

According to a second method, said mixed layer is obtained at a substrate temperature at least equal to 500° C., preferably at least equal to 600° C. and in a particularly preferred manner at least equal to 650° C.

According to another preferred embodiment of this method, said mixed layer is obtained in the presence of auxiliary agents for controlling the relative deposition rates of said first and second nitride(s) or oxynitride(s), or oxide(s) or oxycarbide(s). Thus, the use of a mixture of $SiO_2$ and $SnO_2$ in thermal CVD may result in deposition of $SiO_2$ alone in the absence of $O_2$, or of $SnO_2$ alone with a sufficient amount of $O_2$, it being also possible to obtain all intermediate situations.

Other compounds, notably of fluorine, phosphorus and boron are also available for increasing the rate of deposition of $SiO_2$ relative to $SnO_2$ during formation of the mixed layer. It is not sufficient for these compounds to be Lewis acids. This invention advantageously uses fluorine, not only in order to accelerate the deposition rate of $SiO_2$ relative to that of $SnO_2$ during formation of the mixed layer, but also to dope the sub-layer and to make this itself conductive. The electrical conduction of the sublayer participates in improving the mechanical strength of the multilayer, notably under the effect of an electric field.

The objects of the invention are also:
- a photovoltaic cell including a substrate as described above;
- a tempered and/or curved glass with a radius of curvature at most equal to 2000 mm, preferably at most equal to 500 mm and in a particularly preferred manner at most equal to 300 mm, including a substrate according to the invention. The mechanical strength of the layers deposited on this glass is excellent;
- a shaped heating glass, including a substrate as previously described;
- a plasma screen (PDP for Plasma Display Panel) including a substrate according to the invention:
- a flat lamp electrode including such a substrate.

The invention is illustrated by the following examples.

EXAMPLE 1

Deposition of SiOSn Doped with Fluorine Statically in a Thermal CVD Reactor

Substrate=4 mm glass, dimension 10×20 cm$^2$
MBTCl=0.4 vol. %.
TEOS=1.6 vol. %.
$O_2$=10 vol. %.
TFA=0.5 vol. %.
Temperature of the glass substrate (2 mm Planilux)=650° C.
Total $N_2$ flow rate=1.5 l/min.
The following multilayer was obtained:
Glass/$SiO_2$(10 nm)/mixed SiOSn with an $SiO_2$ gradient towards $SnO_2$/$SnO_2$(10 nm)/$SiO_2$(10 nm)

|  | TFA = 0.5 vol. %. under the above conditions | $CH_3COOH$ = 0.5 vol. %. Under the above conditions |
|---|---|---|
| Obtaining a mixed SiOSn layer | YES | NO |

EXAMPLE 2

Deposition of SiOSn Doped with Fluorine/Undoped $SnO_2$/$SnO_2$ Doped with Fluorine, Carried Out Dynamically in a Thermal CVD Reactor at Atmospheric Pressure Substrate=4 mm extra-clear glass, of dimensions 100×60 cm$^2$.
In a first pass:
MBTCl=0.3 mol/min
TEOS=0.36 mol/min
$O_2$=13 vol. %.
TFA=0.19 mol/min
$H_2O$=2.3 mol/min
Temperature of the glass substrate (Diamant, 4 mm)=650° C.
Total $N_2$ flow rate=1625 Nl/min (Nl=Normoliter=1 liter under 1 atm. and 25° C.)
Rate of passage of the glass=10 m/min
In a second pass:
MBTCl=0.95 mol/min
$O_2$=20 vol. %.
$H_2O$=3.7 mol/min
Temperature of the glass substrate=650° C.
Total $N_2$ flow rate=1600 Nl/min
Rate of passage=10 m/min
In a third pass:
MBTCl=0.47 mol/min
$O_2$=20 vol. %.
TFA=1.85 mol/min
$H_2O$=0.88 mol/min
Temperature of the glass substrate=650° C.
Total $N_2$ flow rate=1600 Nl/min
Rate of passage=10 m/min
The following multilayer was obtained:
Glass/$SiO_2$/mixed SiOSn doped with fluorine with a gradient/$SnO_2$/$SnO_2$ doped with fluorine, as following the SIMS profiles of the elements making up the multilayer showed.

TEM/EDX analysis (Transmission Electron Microscopy/Energy Dispersive X-Ray) showed that the SiOSn layer doped with fluorine had, at increasing distance from the glass substrate, an increasing proportion of Si relative to Sn.

When a mechanical strength test was performed where a 5 cm×5 cm specimen was subjected to treatment for 10 minutes by an electric field of 200 V either side of the substrate, at a temperature of 200° C., the layer was not affected within 24 hours following treatment, contrary to the same layer where the first deposition pass was not carried out. This treatment induced a movement of electric charges of 4 mC/cm$^2$ with a resistivity value of the glass at 200° C. of the order of 7×10$^5$ Ω·m.

This solution was compared with a less efficient solution where the mixed layer was prepared in the same manner but without adding fluorine as a dopant.

|  | Current solution Glass/SiOC/SnO$_2$:F | Solution of the invention-1 Glass/SiOSn/SnO$_2$:F | Solution of the invention-2 Glass/SiOSn:F/SnO$_2$:F |
|---|---|---|---|
| Delamination observed with the treatment described above at the end of 24 hours | YES | NO, but the layer delaminated within the days following the treatment | NO, the layer delaminated more slowly than in the solution of the prior art |

EXAMPLE 3

Si—O—Sn Deposit Prepared Dynamically in a Thermal CVD Reactor at Atmospheric Pressure Substrate=4 mm Saint-Gobain Planilux glass
First pass:
TEOS in bubbler, bubbler temperature 80° C., bubbler nitrogen flow rate 175 Nl/min
MBTCl=5 kg/h
O$_2$=15 vol. %.
TFA=1.5 kg/h
H$_2$O=2.5 kg/h
Temperature of the glass substrate=650° C.
Total N$_2$ flow rate=1600 Nl/min
Rate of passage=10 m/min
In a second pass:
MBTCl=35 kg/h
O$_2$=20 vol. %.
TFA=9 kg/h
H$_2$O=9 kg/h
Temperature of the glass substrate=650° C.
Total N$_2$ flow rate=1600 Nl/min
Rate of passage=10 m/min A layer was obtained with 78% light transmission, a surface resistance equal to 10 ohms and a haze equal to 4%.

With such sub-layers, it was possible to achieve curvatures 4 times greater than with the same layer without a sub-layer.

|  | Current solution: Glass/SnO$_2$:F | Solution of the invention: Glass/SiOSn:F/SnO$_2$:F |
|---|---|---|
| Radius of curvature standardized a the minimum value of the current solution of the state of the art | 1 | 1/4 |

EXAMPLE 4

Ti—O—Sn Deposit Prepared Dynamically in a Thermal CVD Reactor at Atmospheric Pressure Substrate=4 mm Saint-Gobain Planilux glass
In a single pass:
In a slit upstream to the main injection slit: TiPT in bubbler, bubbler temperature 50° C., nitrogen flow rate in the bubbler 125 Nl/min, dilution nitrogen flow rate 375 Nl/min.
In the main injection slit:
MBTCl=15 kg/h
O$_2$=20 vol. %
TFA=7.5 kg/h
H$_2$O=3.7 kg/h
Temperature of the glass substrate=650° C.
Total N$_2$ flow rate=1000 Nl/min
Rate of passage=4 m/min The order of arrival of the precursors involved a multilayer of mixed Glass/TiO$_2$/Ti—O—Sn doped with fluorine with a gradient/SnO$_2$ doped with fluorine.

The layer obtained had a surface resistance of 10 ohms, 80% light transmission and 1.5% haze.

With such sub-layers it was possible to achieve radii of curvature approximately two times less than those of the same layer without a sub-layer, without observing delamination.

|  | Current solution: Glass/SnO$_2$:F | Solution of the invention: Glass/TiOSn:F/SnO$_2$:F |
|---|---|---|
| Radius of curvature standardized at the minimum value of the current solution of the state of the art | 1 | 1/2 |

EXAMPLE 5

Deposition of Si—O—Sn Prepared Dynamically in a Plasma Reactor at Atmospheric Pressure N$_2$ flow rate: 200 l/min
TEOS: 45 sccm
SnCl$_4$: 5 sccm
H$_2$ (diluted to 5% in N$_2$): 2000 sccm
Power of the plasma: 2 W/cm$^2$ with a supply of the impulsed type. The discharge regime was homogeneous.
Temperature of the glass: 150° C.

The deposited layer was amorphous of the SiOSn type, and had a gradient such that the tin concentration was highest at the surface. The rate of deposition of this layer was equal to 200 nm/min. On a scale of 1 to 5, the strength in the photovoltaic test was equal to 4 (the layer withstood the test but finished by delaminating either after 24 hours, or very slightly before 24 hours). The photovoltaic test is understood to mean a ten-minute treatment with an electrical field of 200 V either side of the substrate, at a temperature of 200° C. Delamination or not of the layer was observed in the 24 hours following treatment.

The invention claimed is:

1. An assembly, comprising:
   (I) a transparent glass substrate;
   (II) a mixed layer; and
   (III) a transparent electroconductive layer comprising a doped oxide,
   wherein the mixed layer is interposed between the transparent glass substrate and the transparent electroconductive layer,
   wherein the mixed layer comprises i) a first nitride, oxide, oxynitride, or oxycarbide, and ii) a second nitride, oxide, oxynitride, or oxycarbide, and wherein at least one of the following conditions is satisfied:
  (A) a face of the mixed layer on the side of the transparent glass substrate consists of 2 to 20 nm of at least one first nitride, oxide, oxynitride, or oxycarbide;
  (B) a face of the mixed layer opposite to the transparent glass substrate consists of 2 to 20 nm of at least one second nitride, oxide, oxynitride, or oxycarbide; and
  (C) the assembly further comprises a linking layer, which is a non-doped oxide of the transparent electroconductive layer that links the mixed layer to the electroconductive layer, a cumulative thickness of the linking layer and the transparent electroconductive layer being from 700 to 2000 nm, and a ratio of the thickness of the linking layer to the thickness of the transparent electroconductive layer being from 1:4 and 4:1.

2. The assembly of claim 1, wherein the mixed layer has a composition gradient in which the proportion of the first nitride, oxide, oxynitride, or oxycarbide decreases with increasing distance from the transparent glass substrate.

3. The assembly of claim 1, wherein the mixed layer has a composition gradient in which the proportion of the first nitride, oxide, oxynitride, or oxycarbide increases with increasing distance from the transparent glass substrate.

4. The assembly of claim 1, of having a mechanical strength that is unaffected in the 24 hours following a treatment of at least 10 minutes by an electric field of at least 100 V on either side of the transparent glass substrate, and a temperature of at least 200° C., inducing a movement of electrical charges of at least 2 mC/cm$^2$ according to values of the electrical resistivity of the transparent glass substrate at the test temperature.

5. The assembly of claim 1, wherein the mixed layer and the transparent electroconductive layer together have a haze of at most 30%.

6. The assembly of claim 1, wherein the mixed layer comprises, at its interface with the transparent electroconductive layer, a surface consisting of randomly oriented rods, the rods having a length of 10 to 50 nm long and a diameter of 5 to 20 nm diameter, thereby forming an rms roughness of 10 to 50 nm, and causing an increase in haze of the mixed layer together with the transparent electroconductive layer of 5 to 10% relative to the same mixed layer and transparent electroconductive layer, which has a smooth surface.

7. The assembly of claim 1, wherein the mixed layer and the transparent electroconductive layer together have a light transmission of at least 75%.

8. The assembly of claim 1, wherein the mixed layer and the transparent electroconductive layer together have a surface resistance, $R_\square$, from 5 to 1000 Ω.

9. The assembly of claim 1, wherein the mixed layer and the transparent electroconductive layer together have an absorption in the visible and near-infrared of at most 10%.

10. The assembly of claim 1, wherein the first nitride, oxide, oxynitride, or oxycarbide is a nitride, oxide, oxynitride, or oxycarbide of Si, Al, or Ti.

11. The assembly of claim 1, wherein the second nitride, oxide, oxynitride, or oxycarbide is a nitride, oxide, oxynitride, or oxycarbide of Sn, Zn, or In.

12. The assembly of claim 1, wherein the transparent electroconductive layer comprises an oxide layer doped with Sn, Zn, or In.

13. The assembly of claim 1, wherein the mixed layer has a surface resistance of at most 100,000 Ω.

14. The assembly of claim 1, wherein the mixed layer has a molar ratio F/Sn of at least 0.01.

15. The assembly of claim 1, wherein the mixed layer has a thickness from 20 to 500 nm.

16. The assembly of claim 1, wherein the face of the mixed layer on the side of the transparent glass substrate consists of 2 to 20 nm of at least one first nitride, oxide, oxynitride, or oxycarbide.

17. The assembly of claim 1, wherein the face of the mixed layer opposite to the transparent glass substrate consists of 2 to 20 nm of at least one second nitride, oxide, oxynitride, or oxycarbide.

18. The assembly of claim 1, further comprising:
  the linking layer, the cumulative thickness of the linking layer and the transparent electroconductive layer being from 700 to 2000 nm, and the ratio of the thickness of the linking layer to the thickness of the transparent electroconductive layer being from 1:4 and 4:1.

19. The assembly of claim 1, wherein the transparent electroconductive layer is formed directly on the mixed layer, and the transparent electroconductive layer has a thickness from 300 to 600 nm.

20. The assembly of claim 1, further comprising:
  a protecting layer on the transparent electroconductive layer.

21. The assembly of claim 1, wherein one of the faces of the substrate comprises a multilayer, which provides an anti-reflecting, hydrophobic, or photocatalytic functionality.

22. The assembly of claim 1, wherein the mixed layer comprises grains of the first nitride, oxide, oxynitride, or oxycarbide, mixed with grains of the second nitride, oxide, oxynitride, or oxycarbide.

23. The assembly of claim 1, wherein the mixed layer comprises grains of the first nitride, oxide, oxynitride, or oxycarbide, and grains of the second nitride, oxide, oxynitride, or oxycarbide.

24. The assembly of claim 22, wherein the grains of the first nitride, oxide, oxynitride, or oxycarbide and of the second nitride, oxide, oxynitride, or oxycarbide range in size from 10 to 80 nm, determined under the transmission electron microscope.

25. A method for producing the assembly of claim 1, the method comprising:
  depositing, by a chemical vapor phase deposition method, the mixed layer, wherein the depositing comprises contacting a first precursor of the first nitride, oxide, oxynitride, or oxycarbide and a second precursor of the second nitride, oxide, oxynitride, or oxycarbide with the substrate in the presence of a fluorine compound.

26. The method of claim 25, wherein the chemical vapor phase deposition is plasma-enhanced chemical vapor phase deposition.

27. The method of claim 26, wherein the deposition is carried out at a temperature of the substrate, which is at most 300° C.

28. The method of claim 25, wherein the deposition is carried out at a temperature of the substrate, which is at least 500° C.

29. The method of claim 25, wherein the deposition is carried out in the presence of an auxiliary agent, which controls deposition rate of the first nitride, oxide, oxynitride, or oxycarbide relative to the second nitride oxide, oxynitride, or oxycarbide.

30. The method of claim 25, wherein the fluorine compound is tetrafluoromethane ($CF_4$), octafluoropropane ($C_3F_8$), hexafluoroethane ($C_2F_6$), hydrogen fluoride (HF), difluoro-chloro-methane ($CHClF_2$), difluoro-chloro-ethane ($CH_3CClF_2$), trifluoromethane ($CHF_3$), dichloro-difluoromethane ($CF_2Cl_2$), trifluoro-chloromethane ($CF_3Cl$), trifluoro-bromomethane ($CF_3Br$), trifluoroacetic acid (TFA, $CF_3COOH$), nitrogen fluoride ($NF_3$), or any mixture thereof.

31. A photovoltaic cell, comprising the assembly of claim 1.

32. A tempered and/or curved glass comprising the assembly of claim 1, wherein the tempered and/or curved glass has a radius of curvature at most equal to 2000 mm.

33. A shaped heating glass, comprising the assembly of claim 1.

34. A plasma screen, comprising the assembly of claim 1.

35. A flat lamp electrode, comprising the assembly of claim 1.

* * * * *